United States Patent
Mukai

(10) Patent No.: US 11,258,426 B2
(45) Date of Patent: Feb. 22, 2022

(54) EXTRACTOR

(71) Applicant: Murata Manufacturing Co., Ltd., Nagaokakyo (JP)

(72) Inventor: Takao Mukai, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 79 days.

(21) Appl. No.: 16/898,582

(22) Filed: Jun. 11, 2020

(65) Prior Publication Data

US 2020/0412333 A1 Dec. 31, 2020

(30) Foreign Application Priority Data

Jun. 28, 2019 (JP) .............................. JP2019-121709

(51) Int. Cl.
*H03H 9/25* (2006.01)
*H03H 9/64* (2006.01)

(52) U.S. Cl.
CPC ............ *H03H 9/25* (2013.01); *H03H 9/6409* (2013.01); *H03H 9/6496* (2013.01)

(58) Field of Classification Search
CPC ............ H03H 9/205; H03H 9/25; H03H 9/54; H03H 9/64
See application file for complete search history.

(56) References Cited

U.S. PATENT DOCUMENTS

| | | | | |
|---|---|---|---|---|
| 6,924,715 B2 * | 8/2005 | Beaudin | ............. | H03H 9/14547 330/306 |
| 8,279,021 B2 * | 10/2012 | Hara | .................... | H03H 9/6483 333/133 |
| 9,641,155 B2 * | 5/2017 | Inoue | ....................... | H03H 9/725 |
| 9,722,575 B2 * | 8/2017 | Taniguchi | .............. | H03H 9/706 |
| 10,396,759 B2 * | 8/2019 | Irieda | ...................... | H03H 9/568 |
| 10,756,768 B2 * | 8/2020 | Miyazaki | .................. | H04B 1/00 |
| 10,979,029 B2 * | 4/2021 | Mukai | ....................... | H03H 9/25 |
| 11,012,051 B2 * | 5/2021 | Schmalzl | .................. | H04B 1/18 |
| 2019/0379353 A1 | 12/2019 | Nakahashi | | |

FOREIGN PATENT DOCUMENTS

WO 2018/168503 A1 9/2018

* cited by examiner

*Primary Examiner* — Dean O Takaoka
*Assistant Examiner* — Alan Wong
(74) *Attorney, Agent, or Firm* — Keating & Bennett, LLP

(57) ABSTRACT

An extractor includes a band pass filter and a band elimination filter. One filter of the band pass filter and the band elimination filter includes at least one serial arm resonator and at least one parallel arm resonator that are each defined by an acoustic wave resonator. Any one of the at least one serial arm resonator and the at least one parallel arm resonator includes, among a divided resonator group divided resonator including a plurality of divided resonators coupled in series to each other, a first divided resonator group that is a largest in number of the divided resonators coupled in series and a smallest in capacitance.

10 Claims, 4 Drawing Sheets

EXTRACTOR

CROSS REFERENCE TO RELATED APPLICATIONS

This application claims the benefit of priority to Japanese Patent Application No. 2019-121709 filed on Jun. 28, 2019. The entire contents of this application are hereby incorporated herein by reference.

BACKGROUND OF THE INVENTION

1. Field of the Invention

The present invention relates to an extractor that includes a band pass filter (BPF) and a band elimination filter (BEF).

2. Description of the Related Art

It is desired that a single antenna be ready for communication using different radio frequency bands and different radio systems, such as cellular communication and communication through Wi-Fi (registered trademark) and the global positioning system (GPS). Thus, an extractor where a BPF and a BEF are combined is coupled to an antenna of a radio terminal device. The BPF allows a high-frequency signal having a single radio carrier frequency to pass therethrough. The BEF refuses a high-frequency signal having the radio carrier frequency and allows a high-frequency signal having another radio carrier frequency to pass therethrough.

International Publication No. WO 2018/168503 discloses an extractor having a configuration where a BPF and a BEF are coupled to a common antenna terminal.

The extractor disclosed in International Publication No. WO 2018/168503 includes an acoustic wave resonator. In such an extractor, intermodulation distortion (IMD) can be easily caused by the nonlinearity that the acoustic wave resonator has. In particular, the elimination band of the BEF as an element of the extractor is a band that overlaps at least a portion of the pass band of the BPF, and while attenuating a high-frequency signal having a frequency in the elimination band, the BEF allows a high-frequency signal having another frequency to pass therethrough. Thus, the BEF can be affected by IMD easily. In other words, it is highly likely that IMD of a frequency identical or substantially identical to the frequency of a high-frequency signal desired to pass will be caused in the BEF, and the signal noise (SN) ratio of the high-frequency signal may be lowered.

On the other hand, it is conceivable to divide an acoustic wave resonator into a plurality of divided resonators coupled in series to each other. This is because, compared with a case where an acoustic wave resonator is not divided into a plurality of divided resonators, the power density of each acoustic wave resonator (divided resonator group including a plurality of divided resonators) is smaller and the nonlinear effect is decreased, and occurrence of IMD is able to be significantly reduced or prevented accordingly.

When an acoustic wave resonator is divided into a plurality of divided resonators, however, the area increases and an increase in size of the extractor occurs.

SUMMARY OF THE INVENTION

Preferred embodiments of the present invention provide extractors with a significantly reduced size while significantly reducing or preventing an occurrence of IMD.

According to a preferred embodiment of the present invention, an extractor includes a common terminal, a first input-output terminal, and a second input-output terminal; a band pass filter coupled between the common terminal and the first input-output terminal; and a band elimination filter coupled between the common terminal and the second input-output terminal, an elimination band of the band elimination filter being a band that overlaps at least a portion of a pass band of the band pass filter. In the extractor, one filter of the band pass filter and the band elimination filter includes at least one serial arm resonator and at least one parallel arm resonator that are each defined by an acoustic wave resonator, and any one of the at least one serial arm resonator and the at least one parallel arm resonator includes, among a divided resonator group divided resonator including a plurality of divided resonators coupled in series to each other, a first divided resonator group that is the largest in number of the divided resonators coupled in series and a smallest in capacitance.

Preferred embodiments of the present invention provide extractors with a significantly reduced size while significantly reducing or preventing an occurrence of IMD.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention are described in detail below with reference to the drawings. All of the preferred embodiments described below present comprehensive or specific examples. The values, shapes, materials, elements, arrangements and coupling configurations of the elements, and the like mentioned in the preferred embodiments below are examples and are not intended to limit the present invention. Among the elements in the preferred embodiments below, the elements that are not recited in the independent claim are described as being given elements. In each drawing, elements with the same or substantially the same features are provided with identical references and overlapping descriptions thereof may be omitted or simplified. Further, in the preferred embodiments below, being "coupled" not only represents being directly coupled but also includes being electrically coupled with another element or the like provided therebetween.

Features of an extractor 1 according to a preferred embodiment of the present invention is described with reference to FIGS. 1 and 2.

Figure 1:
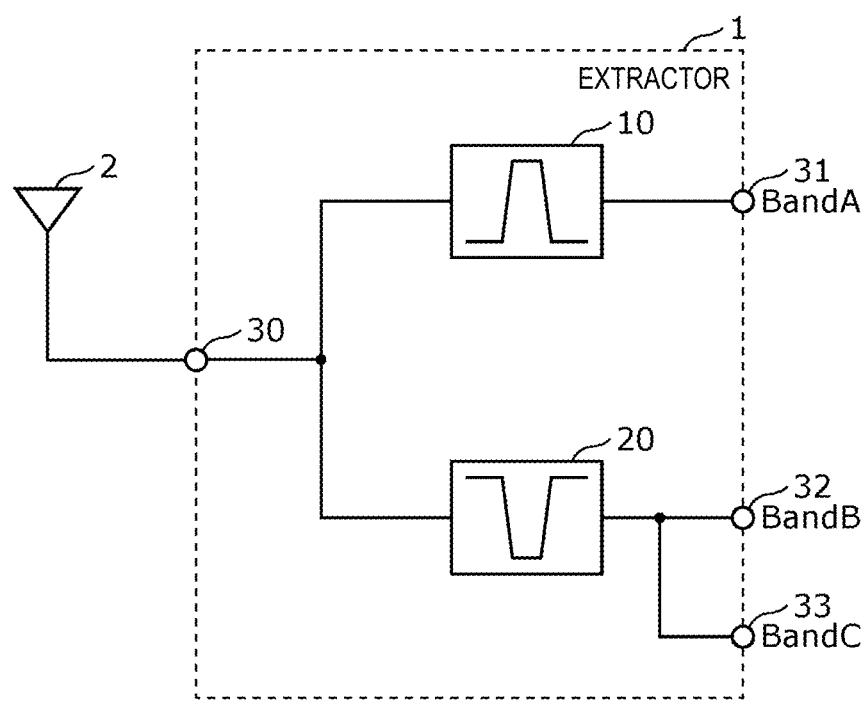
FIG. 1 is a block diagram of an extractor according to a preferred embodiment of the present invention.

FIG. 1 is a block diagram of an extractor 1 according to a present preferred embodiment of the present invention. In FIG. 1, an antenna element 2 is also shown, which is coupled to a common terminal 30 of the extractor 1. The antenna element 2 is, for example, a multiband-ready antenna in conformity with communication standards, such as long term evolution (LTE), and transmits and receives high-frequency signals. Hereinafter, the frequency bands of the high-frequency signals transmitted and received by the antenna element 2 are expressed as BandA, BandB, and BandC. BandA, BandB, and BandC are predetermined frequency bands.

The extractor 1 is a demultiplexing-multiplexing circuit that employs an acoustic wave filter and includes a band pass filter (BPF) 10 and a band elimination filter (BEF) 20.

The BPF 10 is an acoustic wave filter coupled between the common terminal 30 and a first input-output terminal. The BEF 20 is coupled between the common terminal 30 and a second input-output terminal and is an acoustic wave filter whose elimination band is a band that overlaps at least a portion of the pass band of the BPF 10. For example, the BPF 10 allows a high-frequency signal in the frequency band BandA to pass therethrough and the BEF 20 blocks a high-frequency signal in the frequency band BandA. In other words, the pass band of the BEF 20 is wide and high-frequency signals with various frequencies except those in the frequency band BandA are able to pass through the BEF 20. Thus, for example, a filter whose pass band is a predetermined frequency band except the frequency band BandA is coupled to the BEF 20.

The extractor 1 includes the common terminal 30 and input-output terminals 31, 32, and 33. Although the input-output terminals 32 and 33 are coupled to the BEF 20, the number of input-output terminals coupled to the BEF 20 is not limited. To the BEF 20, two or more input-output terminals may be coupled or only one input-output terminal (e.g. only the input-output terminal 32) may be coupled.

The input-output terminal 31 is the first input-output terminal coupled to the BPF 10 and is included, for example, to transmit a high-frequency transmission signal in the frequency band BandA. The input-output terminal 32 is the second input-output terminal coupled to the BEF 20 and is included, for example, to transmit a high-frequency transmission signal in the frequency band BandB. The input-output terminal 33 is coupled to the BEF 20 and is included, for example, to receive a high-frequency reception signal in the frequency band BandC.

One filter of the BPF 10 and the BEF 20 includes at least one serial arm resonator and at least one parallel arm resonator, which are each preferably defined by an acoustic wave resonator, for example.

For example, if the one filter is the BPF 10, the at least one serial arm resonator and the at least one parallel arm resonator define the pass band of the BPF 10. In other words, the BPF 10 may also include an acoustic wave resonator that does not define the pass band of the BPF 10 in addition to the at least one serial arm resonator and the at least one parallel arm resonator.

For example, if the one filter is the BEF 20, the at least one serial arm resonator and the at least one parallel arm resonator define the elimination band of the BEF 20. In other words, the BEF 20 may also include an acoustic wave resonator that does not define the elimination band of the BEF 20 in addition to the at least one serial arm resonator and the at least one parallel arm resonator.

Each acoustic wave resonator that defines the one filter may be one of a surface acoustic wave (SAW) resonator and an acoustic wave resonator using bulk acoustic waves (BAW), for example. The acoustic waves also include, for example, surface waves, Love waves, leaky waves, Rayleigh waves, boundary waves, leakage SAW, dummy SAW, and plate waves, for example.

For example, in the present preferred embodiment, the one filter is the BEF 20 and the BEF 20 includes at least one serial arm resonator and at least one parallel arm resonator. It is not necessarily required for the BPF 10 to include acoustic wave resonators but may be an LC filter, a dielectric filter, or the like, for example, and may have predetermined filter characteristics. In the present preferred embodiment, the BPF 10 also includes acoustic wave resonators.

In the extractor 1 that includes acoustic wave resonators, IMD may be caused easily by the nonlinearity that the acoustic wave resonator has. In particular, the BEF 20 as an element of the extractor 1 has a wide pass band and allows high-frequency signals with frequencies except those in the frequency band BandA to pass therethrough and accordingly, may be affected easily by IMD of various frequencies. Depending on the frequency of a high-frequency signal handled in the extractor 1, IMD of various frequencies may occur. Thus, for example, IMD of a frequency identical or substantially identical to a frequency in the frequency band BandC may be caused by intermodulation between a high-frequency transmission signal in the frequency band BandA and a high-frequency transmission signal in the frequency band BandB. Accordingly, the effect by the IMD may be problematic, for example, a decrease in the SN ratio of a high-frequency reception signal in the frequency band BandC. In addition, if, for example, the frequencies of the frequency band BandA and the frequencies of the frequency band BandB are close to each other, IMD that affects a high-frequency transmission signal in the frequency band BandA or BandB may be caused by intermodulation between a high-frequency transmission signal in the frequency band BandA and a high-frequency transmission signal in the frequency band BandB. The extractor 1 according to the present preferred embodiment is able to address the above-described problems and also significantly reduces a size of the extractor 1.

Circuitry of the extractor 1 is described next with reference to FIG. 2.

Figure 2:
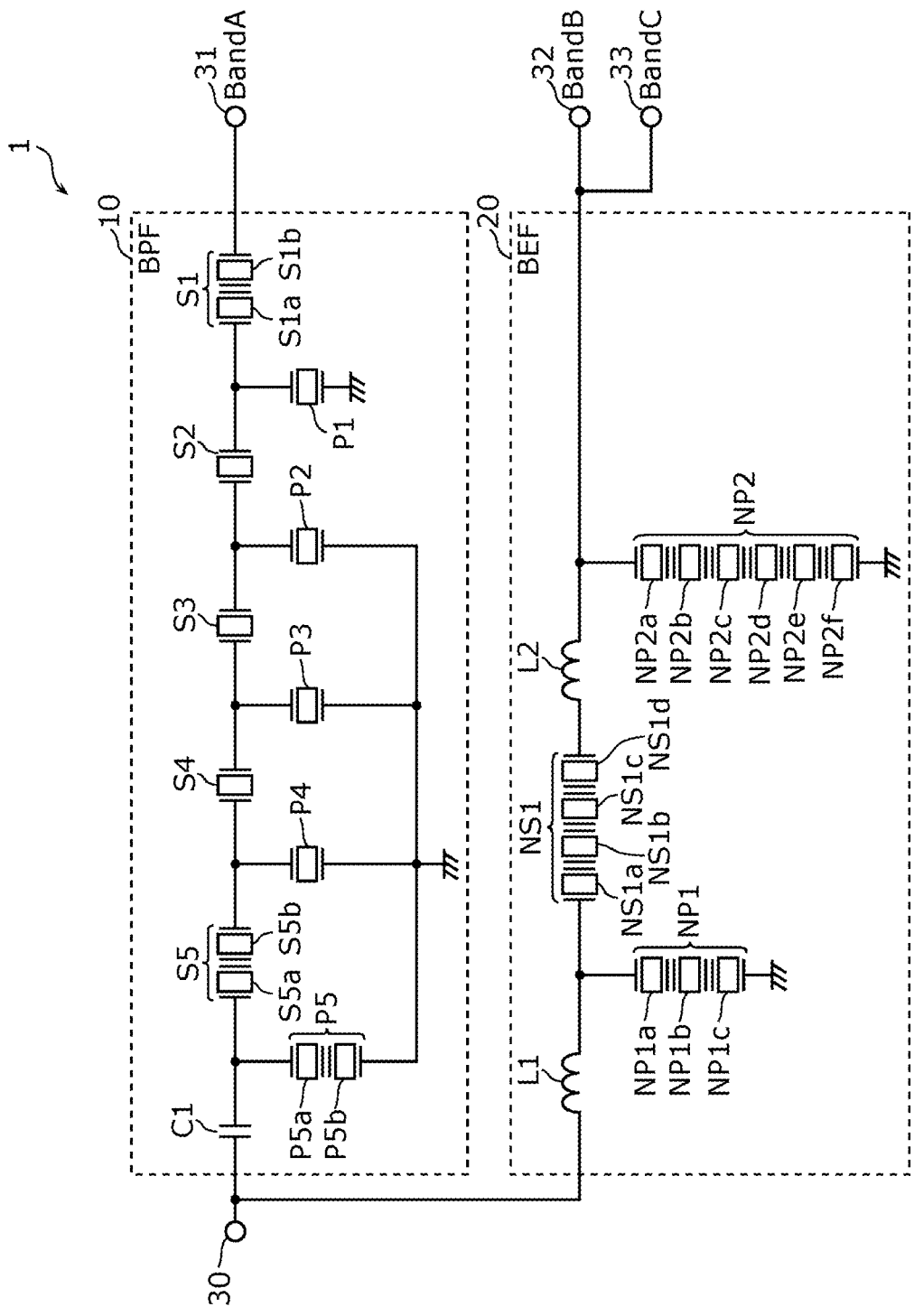
FIG. 2 is a circuit diagram of an extractor according to a preferred embodiment of the present invention.

FIG. 2 is a circuit diagram of the extractor 1 according to the present preferred embodiment.

The BPF 10 includes serial arm resonators S1, S2, S3, S4, and S5, and parallel arm resonators P1, P2, P3, P4, and P5. The BPF 10 may include an impedance element, for example, a capacitor C1. Further, the BPF 10 may include, for example, a longitudinally-coupled resonator and the like (not shown). The serial arm resonators S1, S2, S3, S4, and S5 and the parallel arm resonators P1, P2, P3, P4, and P5 define the pass band of the BPF 10.

The serial arm resonators S1, S2, S3, S4, and S5 and the capacitor C1 are coupled in series to each other on a path that couples the common terminal 30 and the input-output terminal 31. The parallel arm resonator P1 is coupled between a node on the above-described path between the serial arm resonator S1 and the serial arm resonator S2 and the ground. The parallel arm resonator P2 is coupled between a node on the above-described path between the serial arm resonator S2 and the serial arm resonator S3 and the ground. The parallel arm resonator P3 is coupled between a node on the above-described path between the serial arm resonator S3 and the serial arm resonator S4 and the ground. The parallel arm resonator P4 is coupled between a node on the above-described path between the serial arm resonator S4 and the serial arm resonator S5 and the ground. The parallel arm resonator P5 is coupled between a node on the above-described path between the serial arm resonator S5 and the capacitor C1 and the ground.

In the above-described configuration of the BPF 10, the serial arm resonators S1, S2, S3, S4, and S5 defined by acoustic wave resonators are provided on the serial arm path while the parallel arm resonators P1, P2, P3, P4, and P5 defined by acoustic wave resonators are provided on the parallel arm path. Accordingly, an acoustic wave filter that has a low-loss pass band and where the transition band from the pass band to the elimination band is similar to a steep ladder is able to be provided.

For example, the serial arm resonators S1 and S5 and the parallel arm resonator P5 define divided resonator groups that each include a plurality of divided resonators coupled in series to each other. The divided resonator groups denote acoustic wave resonators, in each of which a coupling node between the divided resonators that define the divided resonator group, are coupled in series, and are next to each other is coupled solely to the divided resonators next to each other. For example, no other element is coupled between the divided resonators next to each other and the coupling node between the divided resonators next to each other is not coupled to the ground or the like. The serial arm resonator S1 defines a divided resonator group including divided resonators S1$a$ and S1$b$ coupled in series to each other. The serial arm resonator S5 defines a divided resonator group including divided resonators S5$a$ and S5$b$ coupled in series to each other. The parallel arm resonator P5 defines a divided resonator group including divided resonators P5$a$ and P5$b$ coupled in series to each other.

The BEF 20 includes a serial arm resonator NS1 as at least one serial arm resonator and includes parallel arm resonators NP1 and NP2 as at least one parallel arm resonator. The BEF 20 may include an impedance element, for example, inductors L1 and L2. Further, the BEF 20 may include a longitudinally-coupled resonator and the like (not shown). The serial arm resonator NS1 and the parallel arm resonators NP1 and NP2 define the elimination band of the BEF 20.

The serial arm resonator NS1 and the inductors L1 and L2 are coupled in series to each other on a path that couples the common terminal 30 and the input-output terminal 32. The parallel arm resonator NP1 is coupled between a node on the above-described path between the inductor L1 and the serial arm resonator NS1 and the ground. The parallel arm resonator NP2 is coupled between a node on the above-described path between the inductor L2 and the input-output terminal 32 and the ground.

In the above-described configuration of the BEF 20, the serial arm resonator NS1 defined by an acoustic wave resonator is provided on the serial arm path while the parallel arm resonators NP1 and NP2 defined by acoustic wave resonators are provided on the parallel arm path. Accordingly, an acoustic wave filter that has a low-loss pass band and where the transition band from the pass band to the elimination band is similar to a steep ladder is able to be provided.

The at least one serial arm resonator and the at least one parallel arm resonator in the BEF 20 include a divided resonator group including a plurality of divided resonators coupled in series to each other, which is a first divided resonator group where, among the at least one serial arm resonator and the at least one parallel arm resonator, the number of divided resonators coupled in series is the largest and the capacitance is the smallest. In other words, one acoustic wave resonator of the at least one serial arm resonator and the at least one parallel arm resonator in the BEF 20 defines the first divided resonator group. If the at least one serial arm resonator and the at least one parallel arm resonator includes a divided resonator group other than the first divided resonator group, the first divided resonator group is larger in the number of divided resonators than the divided resonator group other than the first divided resonator group. If the at least one serial arm resonator and the at least one parallel arm resonator do not include any divided resonator group other than the first divided resonator group, the first divided resonator group naturally becomes the largest in the number of divided resonators among the at least one serial arm resonator and the at least one parallel arm resonator. The first divided resonator group is smaller in capacitance or synthetic capacitance than the other resonators or the other divided resonator groups of the at least one serial arm resonator and the at least one parallel arm resonator. Although the first divided resonator group is described later, herein, the parallel arm resonator NP2 defines the first divided resonator group. Further, the at least one serial arm resonator and the at least one parallel arm resonator in the BEF 20 include divided resonator groups other than the first divided resonator group and, for example, the serial arm resonator NS1 and the parallel arm resonator NP1 are also the divided resonator groups. The serial arm resonator NS1 defines the divided resonator group including divided resonators NS1$a$, NS1$b$, NS1$c$, and NS1$d$ coupled in series to each other. The parallel arm resonator NP1 defines the divided resonator group including divided resonators NP1$a$, NP1$b$, and NP1$c$ coupled in series to each other. The parallel arm resonator NP2 defines the divided resonator group including divided resonators NP2$a$, NP2$b$, NP2$c$, NP2$d$, NP2$e$, and NP2$f$ coupled in series to each other.

As described above, the at least one serial arm resonator and the at least one parallel arm resonator in one filter of the BPF 10 and the BEF 20 include at least one divided resonator group. In the present preferred embodiment, the BPF 10 includes the serial arm resonators S1 and S5 and the parallel arm resonator P5 that define respective divided resonator groups while the BEF 20 includes the serial arm resonator NS1 and the parallel arm resonators NP1 and NP2 that define respective divided resonator groups. By dividing an acoustic wave resonator into a plurality of divided resonators, the power density of each divided resonator group becomes smaller and the nonlinear effect is decreased, and the occurrence of IMD is able to be significantly reduced or prevented accordingly, compared with a case where an acoustic wave resonator is not divided into a plurality of divided resonators.

If the number of divided resonators coupled in series (also referred to as the number of divisions) in a divided resonator group is increased, the reduction or prevention of the occurrence of IMD is improved. However, the area of the divided resonator group becomes larger and a reduction in size of the extractor is hindered by layout constraints. That is, reduction or prevention of the occurrence of IMD and reducing a size of the extractor are in the trade-off relationship.

Thus, in the present preferred embodiment, the at least one serial arm resonator and the at least one parallel arm resonator in the BEF 20 include the first divided resonator group. Specifically, the serial arm resonator NS1 and the parallel arm resonators NP1 and NP2 include the first divided resonator group (the parallel arm resonator NP2) that is the largest in number of divisions and the smallest in capacitance among the serial arm resonator NS1 and the parallel arm resonators NP1 and NP2. Table 1 shows the capacitance (synthetic capacitance for each divided resonator group) and the number of divisions of each of the acoustic wave resonators that define the extractor 1.

TABLE 1

| BPF | S1 | P1 | S2 | P2 | S3 | P3 | S4 | P4 | S5 | P5 |
|---|---|---|---|---|---|---|---|---|---|---|
| CAPACITANCE (pF) | 3360 | 2650 | 4900 | 2000 | 3380 | 2930 | 6450 | 4650 | 2130 | 3080 |
| NUMBER OF DIVISIONS | 2 | 1 | 1 | 1 | 1 | 1 | 1 | 1 | 2 | 2 |

| BEF | NS1 | NP1 | NP2 |
|---|---|---|---|
| CAPACITANCE (pF) | 2100 | 1250 | 700 |
| NUMBER OF DIVISIONS | 4 | 3 | 6 |

The synthetic capacitances of the divided resonator groups are calculated based on the following: the number of pairs×the cross width/the number of divisions of the acoustic wave resonator.

As shown in Table 1, the BEF 20 includes the parallel arm resonator NP2, which is the first divided resonator group, that is, the parallel arm resonator NP2 that is the largest in number of divisions and the smallest in capacitance among the serial arm resonator NS1 and the parallel arm resonators NP1 and NP2.

Thus, in the present preferred embodiment, the at least one serial arm resonator and the at least one parallel arm resonator in the BEF 20 (that is, the serial arm resonator NS1 and the parallel arm resonators NP1 and NP2) include the parallel arm resonator NP2 as the first divided resonator group that is the largest in number of divisions and the smallest in capacitance among the at least one serial arm resonator and the at least one parallel arm resonator in the BEF 20. That is, the number of divisions of the divided resonator group that is the smallest in capacitance is caused to be the largest. The area of an acoustic wave resonator decreases as its capacitance is smaller. Therefore, when an acoustic wave resonator is divided while the capacitance is maintained, an increase in size of the extractor is able to be further significantly reduced or prevented if the number of divisions of an acoustic wave resonator small in capacitance is caused to be the largest, compared with a case where the number of divisions of an acoustic wave resonator large in capacitance is caused to be the largest. This is because, when an acoustic wave resonator small in capacitance (that is, small in area) is divided while the capacitance is maintained, the increase rate of the area at the time of division is able to be significantly reduced or prevented in contrast to a case where, when an acoustic wave resonator large in capacitance (that is, large in area) is divided while the capacitance is maintained, the increase rate of the area at the time of division becomes high as well. When, for example, an acoustic wave resonator that has capacitance of 2C is divided into two while the capacitance is maintained, two divided resonators that have capacitance of 4C are coupled in series as a result. In contrast, when an acoustic wave resonator that has capacitance of C is divided into two while the capacitance is maintained, two divided resonators that have capacitance of 2C are coupled in series as a result. As described above, the increase rate of the area at the time of division is able to be further significantly reduced or prevented as the capacitance before the division is smaller. Thus, an extractor with a significantly reduced size while significantly reducing or preventing the occurrence of IMD is able to be provided.

It is not necessarily required for the BEF 20 to include the first divided resonator group and the BPF 10 may include the first divided resonator group. The BPF 10 and the BEF 20 may each include the first divided resonator group.

Even if only one divided resonator group is included in the at least one serial arm resonator and the at least one parallel arm resonator in one filter of the BPF 10 and the BEF 20, the one divided resonator group defines the first divided resonator group that is the largest in number of divisions and the smallest in capacitance among the at least one serial arm resonator and the at least one parallel arm resonator.

A ladder acoustic wave filter includes a coupling portion where the IMD strength may be high easily. Thus, the IMD is able to be significantly reduced or prevented by increasing the number of divisions of the acoustic wave resonator in the coupling portion where the IMD strength may be high easily. The inventor of preferred embodiments of the present invention has reviewed which coupling portion has an effect on the reduction or prevention of IMD. The review is described with reference to FIGS. 3 to 5.

Figure 3:
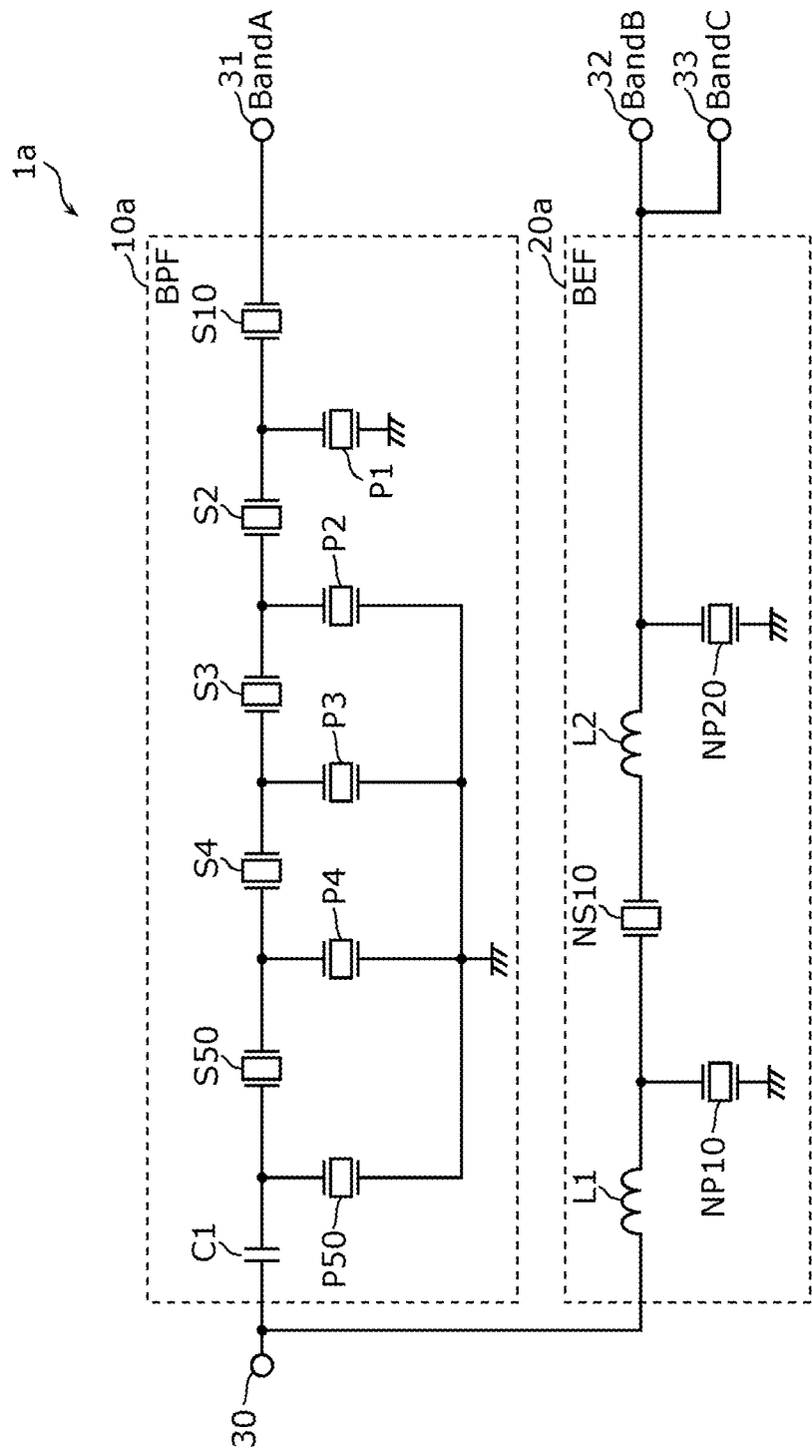
FIG. 3 is a circuit diagram of an extractor according to a comparative example.

FIG. 3 is a circuit diagram of an extractor 1a according to a comparative example.

The extractor 1a includes a BPF 10a and a BEF 20a.

The BPF 10a is different from the BPF 10 in that the BPF 10a includes serial arm resonators S10 and S50 and a parallel arm resonator P50, instead of the serial arm resonators S1 and S5 and the parallel arm resonator P5. In the other respects, the BPF 10a is the same as or similar to the BPF 10 and the descriptions thereof are omitted.

The BPF 10a includes no divided resonator group. The capacitance of the serial arm resonator S10 is identical or substantially identical to the synthetic capacitance of the serial arm resonator S1. That is, the serial arm resonator S1 defines what is provided by dividing the serial arm resonator S10 into two while the capacitance is maintained. The capacitance of the serial arm resonator S50 is identical or substantially identical to the synthetic capacitance of the serial arm resonator S5. That is, the serial arm resonator S5 defines what is provided by dividing the serial arm resonator S50 into two while the capacitance is maintained. The capacitance of the parallel arm resonator P50 is identical or substantially identical to the synthetic capacitance of the parallel arm resonator P5. That is, the parallel arm resonator P5 defines what is provided by dividing the parallel arm resonator P50 into two while the capacitance is maintained.

The BEF 20a is different from the BEF 20 in that the BEF 20a includes a serial arm resonator NS10 and parallel arm resonators NP10 and NP20, instead of the serial arm resonator NS1 and the parallel arm resonators NP1 and NP2. In the other respects, the BEF 20*a* is the same as or similar to the BEF 20 and the descriptions thereof are omitted.

The BEF 20*a* includes no divided resonator group. The capacitance of the serial arm resonator NS10 is identical or substantially identical to the synthetic capacitance of the serial arm resonator NS1. That is, the serial arm resonator NS1 defines what is provided by dividing the serial arm resonator NS10 into four while the capacitance is maintained. The capacitance of the parallel arm resonator NP10 is identical or substantially identical to the synthetic capacitance of the parallel arm resonator NP1. That is, the parallel arm resonator NP1 defines what is provided by dividing the parallel arm resonator NP10 into three while the capacitance is maintained. The capacitance of the parallel arm resonator NP20 is identical or substantially identical to the synthetic capacitance of the parallel arm resonator NP2. That is, the parallel arm resonator NP2 defines what is provided by dividing the parallel arm resonator NP20 into six while the capacitance is maintained.

Figure 4:
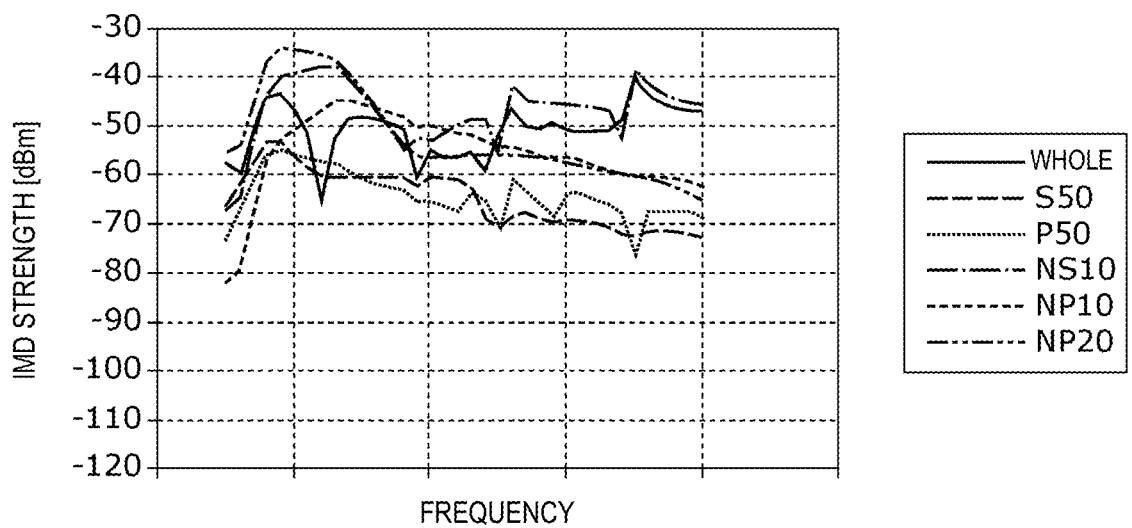
FIG. 4 is a graph showing IMD characteristics of each acoustic wave resonator and the whole of the extractor according to the comparative example.

FIG. 4 is a graph showing IMD characteristics of each acoustic wave resonator and the whole of the extractor 1*a* according to the comparative example. Specifically, FIG. 4 shows simulation results of IMD characteristics of each acoustic wave resonator and the whole in the frequency band BandC, which are provided when IMD of a frequency identical or substantially identical to that of a high-frequency reception signal in the frequency band BandC is caused by intermodulation between a high-frequency transmission signal in the frequency band BandA and a high-frequency transmission signal in the frequency band BandB that occurs at the time at which the high-frequency transmission signal in the frequency band BandA is input to the input-output terminal 31 and the high-frequency transmission signal in the frequency band BandB is input to the input-output terminal 32. FIG. 4 shows the IMD characteristics of the serial arm resonators S50 and NS10 and the parallel arm resonators P50, NP10, and NP20 as acoustic wave resonators high in IMD strength.

As shown in FIG. 4, when the maximum values of the respective IMD strengths of the acoustic wave resonators in the frequency band BandC are compared, the IMD strength of the parallel arm resonator NP2 is the highest. When a high-frequency transmission signal is input to the input-output terminal 32, the power of the high-frequency transmission signal is attenuated more as the distance from the input-output terminal 32 becomes larger, that is, the power of the transmission signal largely acts on the parallel arm resonator NP2 closest to the input-output terminal 32 and the IMD strength may be high easily at the parallel arm resonator NP2. The acoustic wave resonator closest to a terminal denotes an acoustic wave resonator between which and the terminal no other element is coupled or an acoustic wave resonator between which and the terminal other elements are coupled but the number thereof is the smallest.

Thus, the serial arm resonators S10, S50, and NS10 and the parallel arm resonator P50, NP10, and NP20 are divided to be the serial arm resonators S1, S5, and NS1 and the parallel arm resonators P5, NP1, and NP2 so that the number of divisions of the acoustic wave resonator higher in IMD strength is larger. Specifically, the number of divisions of the parallel arm resonator NP20 that is the highest in IMD strength is caused to be six, the number of divisions of the serial arm resonator NS10 with the second highest IMD strength is caused to be four, and the number of divisions of the parallel arm resonator NP10 with the third highest IMD strength is caused to be three. That is, the parallel arm resonator NP2 that is the largest in number of divisions (the first divided resonator group) is the acoustic wave resonator closest to the input-output terminal 32 among the at least one serial arm resonator and the at least one parallel arm resonator (that is, the serial arm resonator NS1 and the parallel arm resonators NP1 and NP2). The numbers of divisions of the serial arm resonators S1 and S5 and the parallel arm resonator P5 that are relatively low in IMD strength are each caused to be two. The extractor 1 shown in FIG. 2 is designed as described above.

Figure 5:
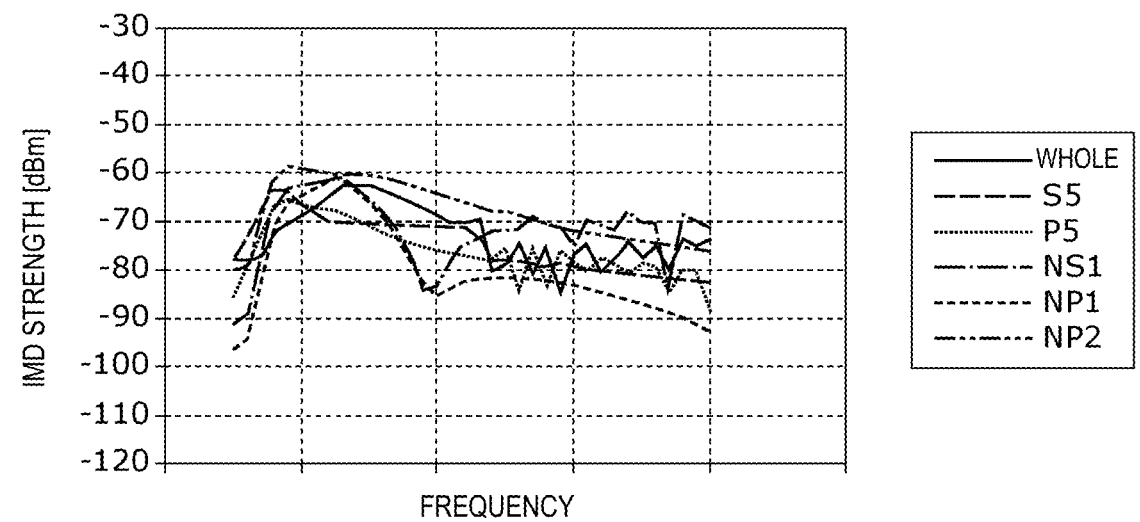
FIG. 5 is a graph showing IMD characteristics of each acoustic wave resonator and the whole of an extractor according to a preferred embodiment of the present invention.

FIG. 5 is a graph showing IMD characteristics of each acoustic wave resonator and the whole of the extractor 1 according to the present preferred embodiment. Specifically, FIG. 5 shows simulation results of IMD characteristics of each acoustic wave resonator and the whole in the frequency band BandC, which are provided when IMD of a frequency identical or substantially identical to that of a high-frequency reception signal in the frequency band BandC is caused by intermodulation between a high-frequency transmission signal in the frequency band BandA and a high-frequency transmission signal in the frequency band BandB that occurs at the time at which the high-frequency transmission signal in the frequency band BandA is input to the input-output terminal 31 and the high-frequency transmission signal in the frequency band BandB is input to the input-output terminal 32. FIG. 5 shows the IMD characteristics of the serial arm resonators S5 and NS1 and the parallel arm resonators P5, NP1, and NP2 as acoustic wave resonators high in IMD strength.

When FIG. 4 and FIG. 5 are compared, the IMD strength of the whole of the extractor 1 is lower than the IMD strength of the whole of the extractor 1*a* before the division. That is, by increasing the number of divisions of an acoustic wave resonator high in IMD strength (specifically, casing the parallel arm resonator NP2 closest to the input-output terminal 32 to be the first divided resonator group), the IMD strength of the whole of the extractor 1 is able to be decreased and the IMD is able to be significantly reduced or prevented. Particularly in the present preferred embodiment, the synthetic capacitance of the parallel arm resonator NP2 large in number of divisions is smaller than the respective synthetic capacitances of the serial arm resonator NS1 and the parallel arm resonator NP1 and thus, a reduction in size of the extractor 1 is able to also be provided.

If the BPF 10 includes the first divided resonator group, the first divided resonator group may be the acoustic wave resonator closest to the input-output terminal 31 among the at least one serial arm resonator and the at least one parallel arm resonator in the BPF 10.

Although the extractor 1 according to the present invention is described above with reference to a preferred embodiment, the present invention is not limited to the above-described preferred embodiment. The present invention also encompasses other preferred embodiments provided by combining elements in the above-described preferred embodiment, variations provided by adding various changes that those skilled in the art may conceive to the above-described preferred embodiment without deviating from the gist of the present invention, and various devices that each include the extractor 1 according to the present invention.

For example, in the above-described preferred embodiment, the first divided resonator group is described as the acoustic wave resonator closest to the input-output terminal 31 or the input-output terminal 32 among the at least one serial arm resonator and the at least one parallel arm resonator but is not limited thereto. For example, the first divided resonator group may be the acoustic wave resonator closest to the common terminal 30 among the at least one serial arm resonator and the at least one parallel arm resonator.

This is because the common terminal 30 is a portion where a signal that passes through the BPF 10 and a signal that passes through the BEF 20 meet and the IMD strength may be high easily at the acoustic wave resonator closest to the common terminal 30. Thus, IMD is able to be significantly reduced or prevented by causing the acoustic wave resonator closest to the common terminal 30 to be the first divided resonator group, that is, by setting the number of divisions thereof the largest.

In addition, it is not necessarily required for the first divided resonator group to be the acoustic wave resonator closest to the input-output terminal 31 or the input-output terminal 32 among the at least one serial arm resonator and the at least one parallel arm resonator nor to be the acoustic wave resonator closest to the common terminal 30. That is, the first divided resonator group may be any acoustic wave resonator among the at least one serial arm resonator and the at least one parallel arm resonator.

The preferred embodiments of the present invention may be widely implemented in communication devices, for example, cellular phones, which each employ a front end circuit provided with an extractor ready to communicate through different radio frequency bands and different radio systems, a transmitter, a receiver, and the like.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An extractor comprising:
   a common terminal, a first input-output terminal, and a second input-output terminal;
   a band pass filter coupled between the common terminal and the first input-output terminal; and
   a band elimination filter coupled between the common terminal and the second input-output terminal, an elimination band of the band elimination filter being a band that overlaps at least a portion of a pass band of the band pass filter; wherein
   one filter of the band pass filter and the band elimination filter includes at least one serial arm resonator and at least one parallel arm resonator that are each defined by an acoustic wave resonator; and
   any one of the at least one serial arm resonator and the at least one parallel arm resonator includes, among a divided resonator group including a plurality of divided resonators coupled in series to each other, a first divided resonator group that is a largest in number of the divided resonators coupled in series and a smallest in capacitance.

2. The extractor according to claim 1, wherein the first divided resonator group is the acoustic wave resonator closest to the first input-output terminal or the second input-output terminal among the at least one serial arm resonator and the at least one parallel arm resonator.

3. The extractor according to claim 2, wherein
   the one filter is the band elimination filter; and
   the first divided resonator group is an acoustic wave resonator closest to the second input-output terminal among the at least one serial arm resonator and the at least one parallel arm resonator.

4. The extractor according to claim 1, wherein the first divided resonator group is the acoustic wave resonator closest to the common terminal among the at least one serial arm resonator and the at least one parallel arm resonator.

5. The extractor according to claim 1, further comprising a third input-output terminal coupled to the band elimination filter.

6. The extractor according to claim 1, wherein the acoustic wave resonator is one of a surface acoustic wave (SAW) resonator and an acoustic wave resonator using bulk acoustic waves (BAW).

7. The extractor according to claim 1, wherein the band pass filter includes one of an LC filter and a dielectric filter.

8. The extractor according to claim 1, wherein a capacitor is coupled in series to the at least one serial arm resonator.

9. The extractor according to claim 1, wherein
   the at least one serial arm resonator is coupled on a first path between the common terminal and the first input-output terminal; and
   the at least one parallel arm resonator is coupled between a node on the first path and a ground.

10. The extractor according to claim 1, wherein an inductor is coupled in series to the at least one serial arm resonator.

* * * * *